United States Patent [19]
Aota et al.

[11] Patent Number: 4,721,927
[45] Date of Patent: Jan. 26, 1988

[54] VOLTAGE-CONTROLLED-OSCILLATOR WITH MODULATOR

[75] Inventors: Toshio Aota, Soma; Toshiki Baba, Odaka, both of Japan

[73] Assignee: Alps Electric Co., Ltd., Japan

[21] Appl. No.: 10,805

[22] Filed: Feb. 4, 1987

[30] Foreign Application Priority Data

May 7, 1986 [JP] Japan .............................. 61-68483[U]

[51] Int. Cl.⁴ ............................................. H03C 3/22
[52] U.S. Cl. ............................... 332/16 T; 331/177 V; 332/18; 455/113
[58] Field of Search ...................... 332/30 V, 16 T, 18, 332/19; 331/36 C, 177 V; 455/42, 113

[56] References Cited
U.S. PATENT DOCUMENTS 4,494,090  1/1985  Popek et al. ................ 332/30 V X
4,510,465  4/1985  Rice et al. .................... 332/30 V X Primary Examiner—Siegfried H. Grimm
Attorney, Agent, or Firm—Guy W. Shoup

[57] ABSTRACT

A voltage-controlled-oscillator with a modulator, comprising a first variable capacitance diode and a second variable capacitance diode. The first variable capacitance diode is connected in series with the second variable capacitance diode to form a resonance device, wherein capacitance of the first variable capacitance diode is controlled by applying a reverse bias voltage and an oscillation frequency control voltage to both ends of the first variable capacitance diode, and capacitance of the second variable capacitance diode is controlled in a reverse direction to changes in the capacitance of the first variable capacitance diode with respect to the oscillation frequency control voltage by applying the oscillation frequency control voltage and a modulation signal to both ends of the second variable capacitance diode to thereby provide a frequency modulated wave.

1 Claim, 6 Drawing Figures

VOLTAGE-CONTROLLED-OSCILLATOR WITH MODULATOR

BACKGROUND OF THE INVENTION

The present invention relates to an improved voltage-controlled-oscillator with a modulator (which will be hereinafter referred to as a VCO) which may provide constant modulation sensitivity characteristics with respect to an oscillation frequency control voltage (which will be hereinafter referred to as a control voltage) in a wide range.

A conventional VCO is generally used in a car telephone and a portable transmitter, etc. requiring a small size, in which an oscillation frequency may be adjusted by a control voltage, and also may be directly modulated to generate an output. FIG. 2 is a circuit diagram of a first example of the VCO in the prior art. Referring to FIG. 2, power is applied from a power supply terminal 20 through an A.C. blocking coil 1 to a collector of an oscillation transistor 7. Bias resistors 3, 4 and 5 are interposed between the collector of the oscillation transistor 7 and a base thereof, between the base and the ground, and between an emitter of the transistor 7 and the ground, respectively. An earthing capacitor 2 is interposed between the base of the transistor 7 and the ground. Feedback capacitors 6 and 8 are interposed between the emitter of the transistor 7 and the ground and between the collector and the emitter, respectively. Further, to the collector is connected a resonance circuit formed by resonance capacitors 9 and 13, variable capacitance diodes 10 and 14 and a microstrip line 18 formed on a substrate, thereby constituting a base grounded type modified Colpitts oscillator circuit. To a cathode of the variable capacitance diode 10 for modulation is applied a modulation signal supplied from a modulation signal input terminal 23 and suitably voltage-divided by modulation signal voltage-dividing resistors 15 and 17. Further, to a cathode of the variable capacitance diode 14 for oscillation frequency control is applied a control voltage supplied from a control voltage terminal 21 through an A.C. blocking coil 12. An oscillation output terminal 22 is connected through an output coupling capacitor 19 to the microstrip line 18. Reference numeral 11 designates a bypass capacitor.

In the above-mentioned circuit, capacitance of the variable capacitance diode 14 is controlled by the control voltage applied to the control voltage terminal 21 to regulate a resonance frequency of the resonance circuit. Further, capacitance of the variable capacitance diode 10 is controlled by the modulation signal applied to the modulation signal input terminal 23 to modulate the resonance frequency, thereby generating a frequency modulated wave from the oscillation output terminal.

FIG. 3 is a circuit diagram of a second example of a VCO in the prior art, in which the same circuit devices as in FIG. 2 are designated by the same reference numerals with explanation therefor omitted.

Referring to FIG. 3, in the resonance circuit connected to the collector of the oscillation transistor 7, the control voltage is applied to both the cathodes of the variable capacitance diodes 10 and 14 for modulation and oscillation frequency control, while the modulation signal is applied to an anode of the variable capacitance diode 10. Reference numerals 24 and 25 designate a resistor and a resonance capacitor.

In the above-mentioned circuit, capacitance of the variable capacitance diode 14 is controlled by the control voltage, and capacitance of the variable capacitance diode 10 is controlled by a potential difference between the control voltage and the modulation signal.

Recently, subscribers for car telephones have increased to result in an increase in the number of channels, requiring a wide bandwidth. Therefore, it is desirable to widen an oscillation frequency range in the VCO and provide uniform modulation sensitivity characteristics over the bandwidth of the oscillation frequency.

Referring to FIG. 4, a curve A shows control voltage-capacitance characteristics of the variable capacitance diode 14, wherein the higher the control voltage, the smaller a change rate of capacitance. Conversely, the lower the control voltage, the larger the change rate of capacitance. In FIG. 5, a curve A shows control voltage - oscillation frequency characteristics of the VCO shown in FIG. 2, in which a change rate of frequency is small in the range of high control voltage, and conversely, it is rapidly increased in the range of low control voltage. Therefore, in the conventional VCO shown in FIG. 2, a change in capacitance of the variable capacitance diode 14 by the modulation signal in the range of high control voltage is widely different from that in the range of low control voltage. As a result, control voltage-modulation sensitivity characteristics are rendered ununiform as shown by a graph A in FIG. 6, wherein the higher the control voltage, the lower the modulation sensitivity, and conversely, the lower the control voltage, the higher the modulation sensitivity.

The conventional VCO shown in FIG. 3 improves the VCO shown in FIG. 2 in such a point that the modulation signal is applied through the resistor 24 to the variable capacitance diode 14 for oscillation frequency control, thereby obtaining a reduced change in capacitance of the variable capacitance diode 14 by the modulation signal as compared with the VCO in FIG. 2. A graph B in FIG. 6 shows the control voltage - modulation sensitivity characteristics of the VCO in FIG. 3, wherein changes in the modulation sensitivity in the range of high and low control voltages are improved, but not yet satisfactory.

Additionally, in the frequency synthesizer using the conventional VCO having non-linear control voltage-oscillation frequency characteristics as mentioned above, there occurs a problem such that noise characteristics are deteriorated in the range of low control voltage and large change rate of oscillation frequency.

SUMMARY OF THE INVENTION

It is an object of the presemt invention to provide a VCO which may provide constant modulation sensitivity characteristics with respect to a control voltage in a wide range.

It is another object of the present invention to provide a VCO which is suitable for a car telephone and a portable transmitter each requiring a frequency modulated wave of a wide bandwidth.

It is a further object of the present invention to provide a VCO which may be adapted to a frequency synthesizer having improved noise characteristics.

According to the present invention, there is provided a voltage-controlled-oscillator with a modulator, comprising a first variable capacitance diode and a second variable capacitance diode, the first variable capacitance diode being connected in series with the second variable capacitance diode to form a resonance device, wherein capacitance of the first variable capacitance diode is controlled by applying a reverse bias voltage and an oscillation frequency control voltage to both ends of the first variable capacitance diode, and capacitance of the second variable capacitance diode is controlled in a reverse direction to changes in the capacitance of the first variable capacitance diode with respect to the oscillation frequency control voltage by applying the oscillation frequency control voltage and a modulation signal to both ends of the second variable capacitance diode to thereby provide a frequency modulated wave.

As is described above, the reverse bias voltage and the control voltage are applied to both ends of the first variable capacitance diode forming the resonance device to control the capacitance of the first variable capacitance diode, and the control voltage and the modulation signal are applied to both ends of the second variable capacitance diode to control the capacitance of the second variable capacitance diode in a reverse direction to changes in the capacitance of the first variable capacitance diode with respect to the control voltage. Generally, a change rate of the capacitance of the second variable capacitance diode in the range of a high control voltage is widely different from that in the range of a low control voltage. However, such a difference may be corrected by the first variable capacitance diode to thereby provide a substantially linear relation between the control voltage of the VCO and the oscillation frequency. Thus, it is possible to obtain constant modulation sensitivity characteristics with respect to the control voltage in a wide range.

Other objects and features of the invention will be more fully understood from the following detailed description and appended claims when taken with the accompaning drawings.

DETAILED DESCRIPTION OF THE PREFERRED EMBODIMENT

Figure 1:
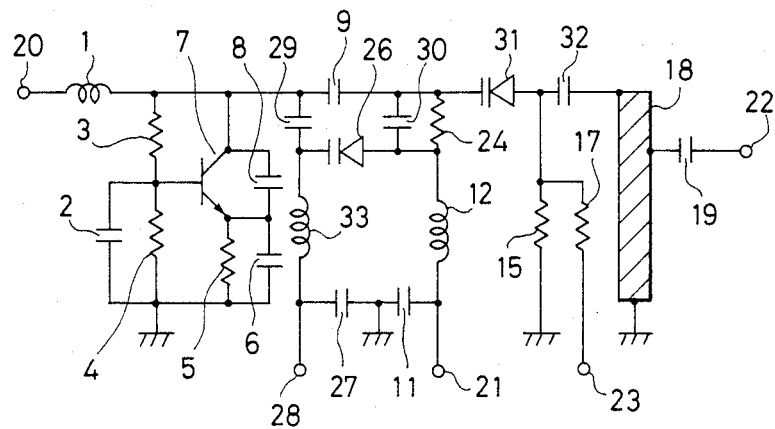
FIG. 1 is a circuit diagram of a preferred embodiment of the VCO according to the present invention.
Figure 2:
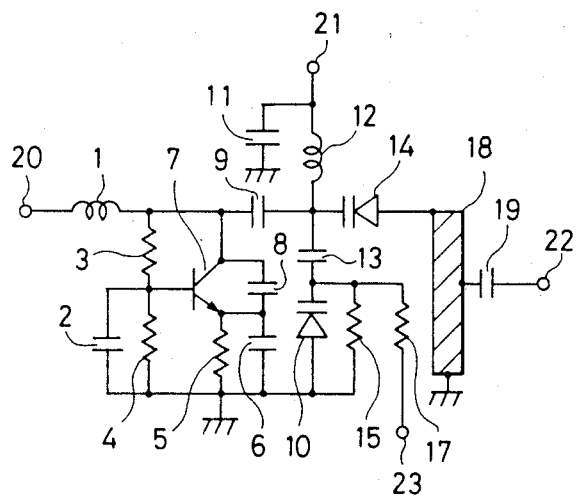
FIG. 2 is a circuit diagram of a first example of the VCO in the prior art.
Figure 3:
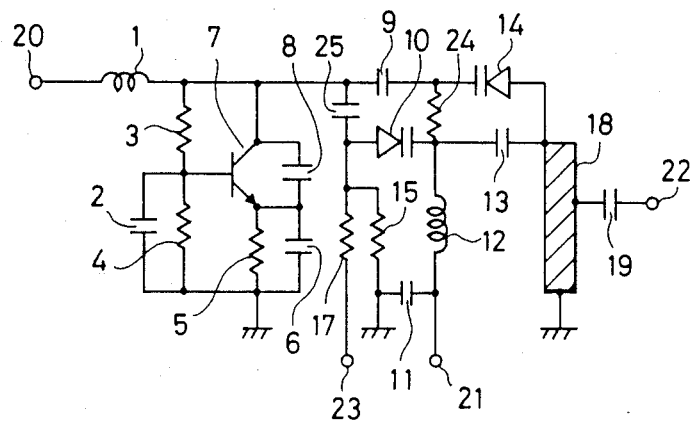
FIG. 3 is a circuit diagram, of a second example of the VCO in the prior art.

FIG. 1 shows a circuit diagram of a preferred embodiment of the VCO according to the present invention, wherein the same circuit devices as in FIGS. 2 and 3 are designated by the same reference numerals with the explanation therefor omitted.

Referring to FIG. 1, a collector of an oscillation transistor 7 is connected with each one end of a resonance capacitor 9 and an A.C. blocking capacitor 29. The other end of the resonance capacitor 9 is connected in series through a variable capacitance diode 31, a resonance capacitor 32 and a microstrip line 18 to the ground. An anode of the variable capacitance diode 31 is connected through a modulation signal voltage dividing resistor 17 to a modulation signal input terminal 23, and is also connected through another modulation signal voltage dividing resistor 15 to the ground. A cathode of the variable capacitance diode 31 is connected in parallel through a resistor 24 and a capacitance correcting capacitor 30 to an anode of a variable capacitance diode 26, which anode is in turn connected through an A.C. blocking coil 12 to a control voltage terminal 21. The other end of the A.C. blocking capacitor 29 is connected to a cathode of the variable capacitance diode 26, and is also connected through an A.C. blocking coil 33 to a bias voltage terminal 28. The control voltage terminal 21 and the bias voltage terminal 28 are connected through bypass capacitors 11 and 27, respectively, to the ground. The variable capacitance diode 26 is reverse-biased by the potential difference between a reverse bias voltage applied to the bias voltage terminal 28 and a control voltage applied to the control voltage terminal 21 to vary its capacitance. The variable capacitance diode 31 is reverse-biased by the potential difference between the control voltage and a voltage-divided signal of a modulation signal applied to the modulation signal input terminal 23 to vary its capacitance. Thus, the first variable capacitance diode 26 for compensating modulation sensitivity is connected in series with the second variable capacitance diode 31 for oscillation frequency control and modulation to form a resonance device.

Figure 4:
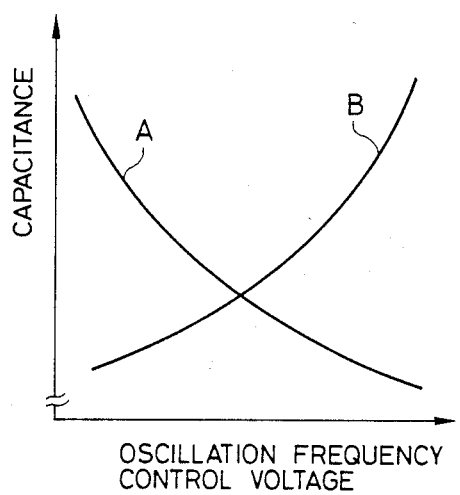
FIG. 4 is a graph showing control voltage-capacitance characteristics of the variable capacitance diode.
Figure 5:
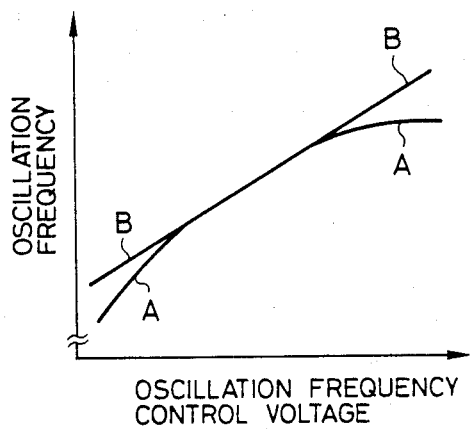
FIG. 5 is a graph showing control voltage-oscillation frequency characteristics of the variable capacitance diode.
Figure 6:
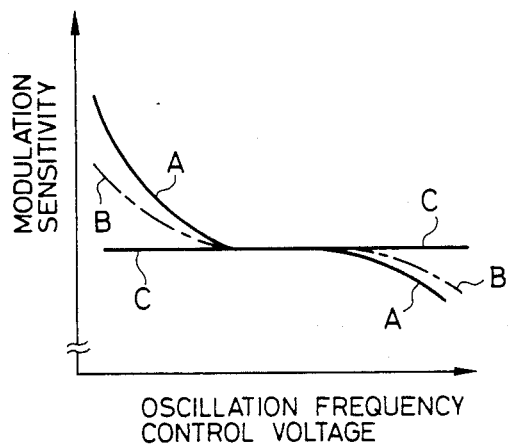
FIG. 6 is a graph showing control voltage-modulation sensitivity characteristics of the variable capacitance diode.

Referring to FIG. 4, a curve A shows control voltage-capacitance characteristics of the variable capacitance diode 31, while a curve B shows control voltage-capacitance characteristics of the variable capacitance diode 26. In the variable capacitance diode 26, a control voltage is applied to its anode, and a reverse bias voltage higher than the control voltage is applied to its cathode. Therefore, the higher the control voltage, the larger a change rate of capacitance. Conversely, the lower the control voltage, the smaller the change rate of capacitance. The change rate of capacitance of the variable capacitance diode 26 and that of the variable capacitance diode 31 are in a reverse relationship with each other, and accordingly, as shown by a graph B in FIG. 5, the relation between the control voltage of the VCO and the oscillation frequency may be corrected to provide linearity. As is apparent from a graph C in FIG. 6, substantially constant modulation sensitivity characteristics of the VCO may be obtained in a wide range of the control voltage.

Although the variable capacitance diode 31 is provided for both the oscillation frequency control and the modulation in the aforementioned embodiment, two variable capacitance diodes may be independently provided for the oscillation frequency control and the modulation, respectively.

While the invention has been described with reference to specific embodiments, the description is illustrative and is not to be construed as limiting the scope of the invention. Various modifications and changes may occur to those skilled in the art without departing from the spirit and scope of the invention as defined by the appended claim.

What is claimed is:

1. A voltage-controlled-oscillator with a modulator, comprising a first variable capacitance diode and a second variable capacitance diode, said first variable capacitance diode being connected in series with said second variable capacitance diode to form a resonance device, wherein capacitance of said first variable capacitance diode is controlled by applying a reverse bias voltage and an oscillation frequency control voltage to both ends of said first variable capacitance diode, and capacitance of said second variable capacitance diode is controlled in a reverse direction to changes in the capacitance of said first variable capacitance diode with respect to said oscillation frequency control voltage by applying said oscillation frequency control voltage and a modulation signal to both ends of said second variable capacitance diode to thereby provide a frequency modulated wave.

* * * * *